(12) United States Patent
Aoyama et al.

(10) Patent No.: US 8,815,352 B2
(45) Date of Patent: Aug. 26, 2014

(54) FILM FORMING METHOD AND METHOD FOR MANUFACTURING FILM-FORMATION SUBSTRATE

(75) Inventors: Tomoya Aoyama, Kanagawa-ken (JP); Hisao Ikeda, Kanagawa-ken (JP); Satoshi Inoue, Osaka (JP); Tohru Sonoda, Osaka (JP)

(73) Assignees: Semiconductor Energy Laboratory Co., Ltd. (JP); Sharp Kabushiki Kaisha (JP)

( * ) Notice: Subject to any disclaimer, the term of this patent is extended or adjusted under 35 U.S.C. 154(b) by 0 days.

(21) Appl. No.: 13/635,177

(22) PCT Filed: Feb. 28, 2011

(86) PCT No.: PCT/JP2011/054531
§ 371 (c)(1),
(2), (4) Date: Sep. 14, 2012

(87) PCT Pub. No.: WO2011/114873
PCT Pub. Date: Sep. 22, 2011

(65) Prior Publication Data
US 2013/0022757 A1 Jan. 24, 2013

(30) Foreign Application Priority Data
Mar. 18, 2010 (JP) ................................. 2010-062710

(51) Int. Cl.
*B05D 3/06* (2006.01)
*B05D 3/00* (2006.01)
(52) U.S. Cl.
USPC .......................................... 427/557; 427/561
(58) Field of Classification Search
USPC ................................................ 427/557, 561
See application file for complete search history.

(56) References Cited

U.S. PATENT DOCUMENTS

| 4,588,674 A | * | 5/1986 | Stewart et al. ............. 430/273.1 |
| 5,904,961 A | | 5/1999 | Tang et al. |

(Continued)

FOREIGN PATENT DOCUMENTS

| CN | 1369573 A | 9/2002 |
| CN | 1436025 A | 8/2003 |

(Continued)

OTHER PUBLICATIONS

Ronova et al, Influence of chemical structure on glass transition temperature of polyimides, 2010, Struct Chem, 21, p. 1013-1020.*

(Continued)

*Primary Examiner* — Dah-Wei D Yuan
*Assistant Examiner* — Nga Leung V Law
(74) *Attorney, Agent, or Firm* — Husch Blackwell LLP

(57) ABSTRACT

One embodiment of the present invention is a film forming method including the steps of forming an absorption layer 12 over one surface of a first substrate 11; forming a layer 16 containing a high molecular compound over the absorption layer; removing an impurity in the layer containing the high molecular compound by performing a first heat treatment on the layer 16; forming a material layer 18 containing a first film formation material and a second film formation material over the layer 16; performing a second heat treatment to form a mixed layer 19 in which the material layer and the layer 16 are mixed over the absorption layer; and performing third heat treatment to form a layer 19a containing the first film formation material and the second film formation material on a film-formation target surface of a second substrate.

9 Claims, 3 Drawing Sheets

(56) References Cited

U.S. PATENT DOCUMENTS

| | | | |
|---|---|---|---|
| 6,610,455 | B1 | 8/2003 | Burberry et al. |
| 7,691,783 | B2 | 4/2010 | Matsuda et al. |
| 7,767,489 | B2 | 8/2010 | Kwon et al. |
| 8,119,204 | B2 | 2/2012 | Ikeda et al. |
| 2002/0139303 | A1 | 10/2002 | Yamazaki et al. |
| 2004/0001972 | A1 | 1/2004 | Chin et al. |
| 2005/0095459 | A1 | 5/2005 | Chin et al. |
| 2005/0142380 | A1 | 6/2005 | Chin et al. |
| 2006/0061267 | A1 | 3/2006 | Yamasaki et al. |
| 2006/0246240 | A1 | 11/2006 | Matsuda et al. |
| 2007/0082288 | A1 | 4/2007 | Wright et al. |
| 2007/0257276 | A1 | 11/2007 | Kwon et al. |
| 2007/0290611 | A1 | 12/2007 | Yamasaki et al. |
| 2008/0233827 | A1 | 9/2008 | Kagami et al. |
| 2008/0241733 | A1 | 10/2008 | Wright et al. |
| 2008/0268135 | A1 | 10/2008 | Yokoyama et al. |
| 2008/0268137 | A1* | 10/2008 | Ikeda et al. ............ 427/70 |
| 2009/0058285 | A1 | 3/2009 | Yamazaki et al. |
| 2009/0104403 | A1 | 4/2009 | Aoyama et al. |
| 2012/0148730 | A1 | 6/2012 | Ikeda et al. |

FOREIGN PATENT DOCUMENTS

| | | |
|---|---|---|
| CN | 1469692 A | 1/2004 |
| CN | 101040396 A | 9/2007 |
| CN | 101068042 A | 11/2007 |
| CN | 101272643 A | 9/2008 |
| CN | 101283627 A | 10/2008 |
| CN | 101397649 A | 4/2009 |
| EP | 1 335 637 A1 | 8/2003 |
| EP | 1 852 921 A2 | 11/2007 |
| JP | 10-245547 | 9/1998 |
| JP | 2002-302757 | 10/2002 |
| JP | 2003-229259 | 8/2003 |
| JP | 2004-39630 | 2/2004 |
| JP | 2006-86069 | 3/2006 |
| JP | 2006-309995 | 11/2006 |
| JP | 2007-299736 | 11/2007 |
| JP | 2008-235010 | 10/2008 |
| JP | 2008-288017 | 11/2008 |
| JP | 2008288017 A * | 11/2008 |
| JP | 2008-291352 | 12/2008 |
| JP | 2009-69849 | 4/2009 |
| JP | 2010-7101 | 1/2010 |
| KR | 2002-0064215 | 8/2002 |
| KR | 10-2004-0001381 | 1/2004 |
| KR | 10-2007-0029768 | 3/2007 |
| KR | 10-0731755 B1 | 6/2007 |
| KR | 10-2007-0072521 | 7/2007 |
| KR | 10-2008-0063294 | 7/2008 |
| KR | 10-2008-0085705 | 9/2008 |
| KR | 10-2008-0096381 | 10/2008 |
| KR | 10-2010-00020078 | 1/2010 |
| WO | WO 2006/036297 A2 | 4/2006 |
| WO | WO 2007/044518 A1 | 4/2007 |

OTHER PUBLICATIONS

International Search Report re application No. PCT/JP2011/054531, dated Apr. 19, 2011.

* cited by examiner

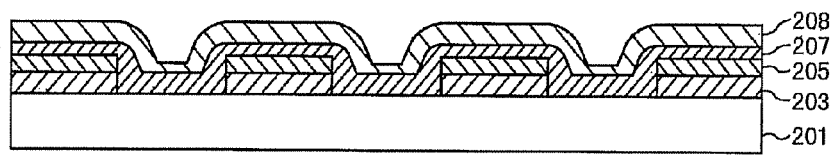
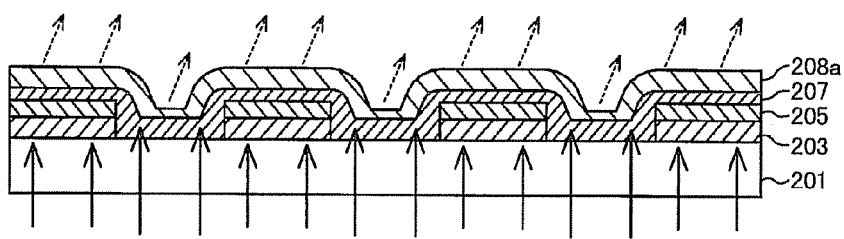
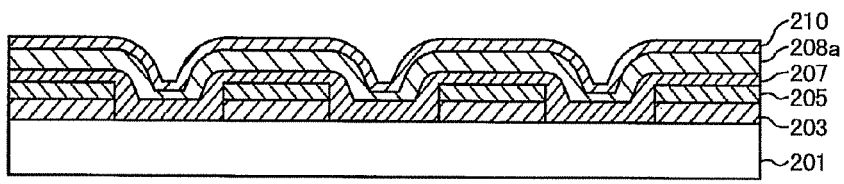

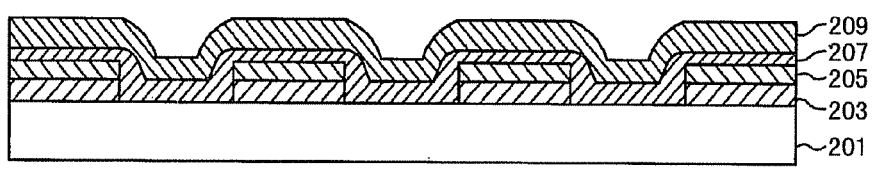
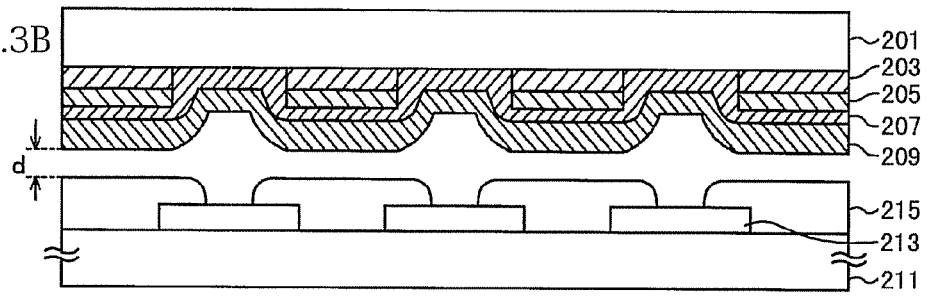
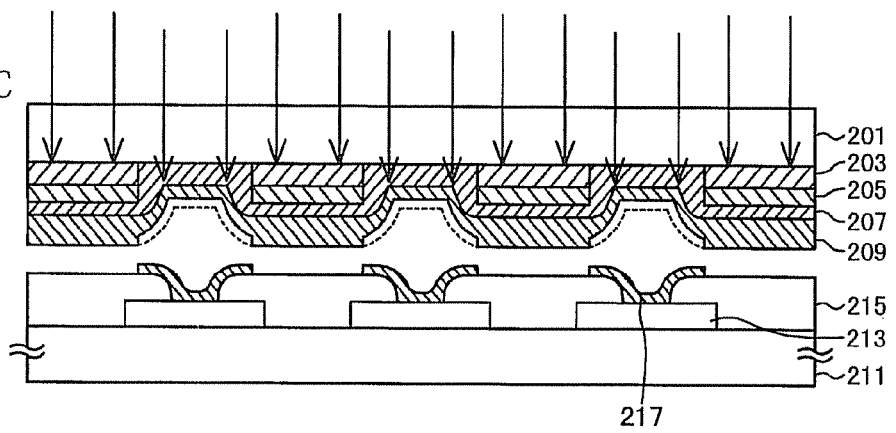

FILM FORMING METHOD AND METHOD FOR MANUFACTURING FILM-FORMATION SUBSTRATE

TECHNICAL FIELD

The present invention relates to a film forming method and a method for manufacturing a film-formation substrate.

BACKGROUND ART

In recent years, research has been actively conducted on light-emitting elements using electroluminescence (Electro Luminescence, hereinafter referred to as "EL"). In a basic structure of such a light-emitting element, a light-emitting layer containing a light-emitting substance is interposed between a pair of electrodes. By applying a voltage to this element, light emission can be obtained from the light-emitting substance.

As a film forming method of a light-emitting layer without a metal mask, there is a method in which an organic EL material layer is formed over a film-fat Illation substrate by a wet method using a polymer in which a film formation material is dispersed, and this organic EL material layer is formed over a film-formation target substrate through thermal transfer (for example, see Patent Document 1).

PRIOR ART DOCUMENT

Patent Document

Patent Document 1: Japanese Published Patent Application No. 2008-291352

SUMMARY OF INVENTION

Problems to be Solved by the Invention

Since a wet method is used in the film forming method of a light-emitting layer using a polymer as a binder, there is a problem in that an impurity such as moisture or a residual solvent is contained in an organic EL material layer formed over a film-formation substrate, and the impurity is also mixed into the light-emitting layer formed through thermal transfer over a film-formation target substrate.

It is an object of one embodiment of the present invention to provide a film forming method that can reduce an impurity mixed into a layer formed over a film-formation target substrate or a method for manufacturing a film-formation substrate used in this film forming method.

Means for Solving the Problems

One embodiment of the present invention is a film forming method including the steps of forming an absorption layer over one surface of a first substrate; forming a layer containing a high molecular compound which satisfies a formula (1) below over the absorption layer; removing an impurity in the layer containing the high molecular compound by performing a first heat treatment on the layer containing the high molecular compound at a temperature higher than or equal to the glass transition temperature of the high molecular compound from the other surface of the first substrate; forming a material layer containing a first film formation material and a second film formation material over the layer containing the high molecular compound; performing a second heat treatment on the material layer and the layer containing the high molecular compound to form a mixed layer in which the material layer and the layer containing the high molecular compound are mixed; placing one surface of the first substrate and a film formation target surface of a second substrate so as to face each other; and performing third heat treatment on the mixed layer from the other surface of the first substrate to form a layer containing the first film formation material and the second film formation material over the film-formation target surface of the second substrate.

$$Ta-100 \leq S \leq 400 \qquad (1)$$

Note that in the formula (1), S represents a glass transition temperature (° C.) of a high molecular compound, and Ta represents a temperature (° C.) which is the higher of sublimation temperatures of the first film formation material and the second film formation material.

According to one embodiment of the present invention, after a layer containing a high molecular compound is fanned over an absorption layer of a first substrate, a first heat treatment by which this layer is heated to a temperature higher than or equal to the glass transition temperature of the high molecular compound is performed. Thus, an impurity such as moisture, a residual solvent, or a residual monomer can be removed from the layer, so that the layer in which the amount of an impurity is reduced can be obtained. As a result, a mixed layer in which the amount of an impurity is reduced can be obtained. Accordingly, an impurity in the layer which contains the first film formation material and the second film formation material and which is formed by transfer onto the second substrate can be reduced.

Further, in a film forming method according to one embodiment of the present invention, it is preferable that the first heat treatment, the second heat treatment, and the third heat treatment be each performed using a method of applying heat by light irradiation from the other surface of the first substrate using a light source and by absorption of the light in the absorption layer.

Another embodiment of the present invention is a method for manufacturing a film-formation substrate, including the steps of forming an absorption layer over one surface of a first substrate; forming a layer containing a high molecular compound which satisfies a formula (1) below over the absorption layer; removing an impurity in the layer containing the high molecular compound by performing first heat treatment on the layer containing the high molecular compound at a temperature higher than or equal to the glass transition temperature of the high molecular compound from the other surface of the first substrate; forming a material layer containing a first film formation material and a second film formation material over the layer containing the high molecular compound; and performing second heat treatment on the material layer and the layer containing the high molecular compound to form a mixed layer in which the material layer and the layer containing the high molecular compound are mixed over the absorption layer.

$$Ta-100 \leq S \leq 400 \qquad (1),$$

wherein S represents a glass transition temperature (° C.) of a high molecular compound, and Ta represents a temperature (° C.) which is the higher of sublimation temperatures of the first film formation material and the second film formation material.

Further, in a method for manufacturing a film-formation substrate according to one embodiment of the present invention, it is preferable that the first heat treatment and the second heat treatment be each performed using a method of applying heat by light irradiation from the other surface of the first substrate using a light source and by absorption of the light in the absorption layer.

Effect of the Invention

By application of one embodiment of the present invention, it is possible to provide a film forming method that can reduce an impurity mixed into a layer formed over a film-formation target substrate or a method for manufacturing a film-formation substrate used in this film forming method.

BRIEF DESCRIPTION OF DRAWINGS

FIGS. 2A to 2C are cross-sectional views for illustrating a film forming method of one embodiment of the present invention.

FIGS. 3A to 3C are cross-sectional views for illustrating a film forming method of one embodiment of the present invention.

MODE FOR CARRYING OUT THE INVENTION

Hereinafter, embodiments of the present invention will be described in detail with reference to drawings. However, the present invention is not limited to the following description and it is easily understood by those skilled in the art that the modes and details can be variously changed without departing from the spirit and scope of the present invention. Therefore, the present invention should not be construed as being limited to the description in the following embodiments.

(Embodiment 1)

In this embodiment, a film forming method of one embodiment of the present invention is described. Note that in this embodiment, a case in which an EL layer of a light-emitting element is formed using the film forming method of one embodiment of the present invention is described. Further, in this embodiment, the case in which heat treatment is performed using a light source is described. FIGS. 1A to 1F are cross-sectional views for illustrating the film forming method of one embodiment of the present invention.

First, a method for manufacturing a film-formation substrate (donor substrate) 10 which is illustrated in FIGS. 1A to 1E is described.

Figure 1A:
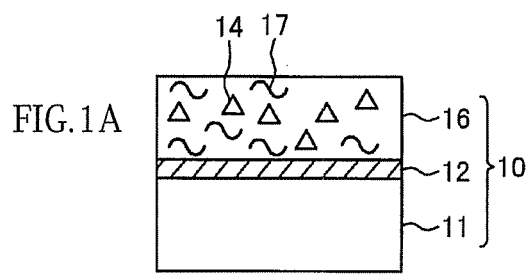
FIGS. 1A to 1F are cross-sectional views for illustrating a film forming method of one embodiment of the present invention.

As illustrated in FIG. 1A, an absorption layer 12 is formed over one surface of a first substrate 11, and a layer 16 containing a high molecular compound (a polymer) 17 and an impurity 14 is formed over the absorption layer 12 by a wet method. As a wet method, a spin coating method, a spray coating method, an inkjet method, a dip coating method, a casting method, a die coating method, a roll coating method, a blade coating method, a bar coating method, a gravure coating method, a nozzle-printing method, a printing method, or the like can be used. Note that the viscosity of a high molecular compound is easily adjusted, so that the viscosity of a solution of a high molecular compound can be freely adjusted depending on application. Adjustment of the viscosity of a high molecular compound can be realized by adjusting the molecular weight of a high molecular compound or changing the ratio of a high molecular compound to a solvent. In general, the viscosity of the solution is increased as the ratio of the high molecular compound is increased.

The first substrate 11 is a substrate that transmits irradiation light for forming a film of the material layer over the film-formation target substrate. Accordingly, the first substrate 11 is preferably a substrate having high light transmittance. Specifically, in the case where lamp light or laser light is used in order to form the material layer, a substrate that transmits the light is preferably used as the first substrate 11. As the first substrate 11, a glass substrate, a quartz substrate, a plastic substrate containing an inorganic material, or the like can be used, for example.

The absorption layer 12 is a layer which absorbs irradiation light for heating the layer 16, a material layer 18 or a mixed layer 19 that is to be formed in a later step and converts the light to heat. Therefore, the absorption layer 12 may be formed at least in a region through which the layer 16 or the like is heated and may be formed to have an island shape, for example. The absorption layer 12 is preferably faulted using a material having a reflectance of as low as 70% or less and having high absorptance with respect to irradiation light. Further, it is preferable that the absorption layer 12 be formed using a material having excellent heat resistance so that it does not change with heat. For the absorption layer 12, for example, a metal nitride such as titanium nitride, tantalum nitride, molybdenum nitride, tungsten nitride, chromium nitride, or manganese nitride; molybdenum; titanium; tungsten; carbon; or the like is preferably used.

The absorption layer 12 can be formed by any of a variety of methods. For example, by a sputtering method, the absorption layer 12 can be formed using a target using molybdenum, tantalum, titanium, tungsten, or the like, or a target using an alloy thereof. In addition, the absorption layer 12 is not limited to a single layer and may include a plurality of layers.

It is, preferable that the absorption layer 12 have a thickness such that it does not transmit irradiation light. It is preferable that the thickness be greater than or equal to 100 nm and less than or equal to 2 μm although it depends on a material. In particular, the absorption layer 12 having a thickness greater than or equal to 100 nm and less than or equal to 600 nm can efficiently absorb the irradiation light to generate heat.

Note that the absorption layer 12 may transmit part of the irradiation light as long as a first film formation material and a second film formation material which are contained in the mixed layer 19 are heated to a film formation temperature. However, in the case where the absorption layer 12 transmits part of the light, a material that does not decompose even when irradiated with light is preferably used for the mixed layer 19. Further, a "film formation temperature" is a temperature at which at least part of a film formation material is transferred from a film-formation substrate to a film-formation target substrate by the action of heat.

Figure 1E:
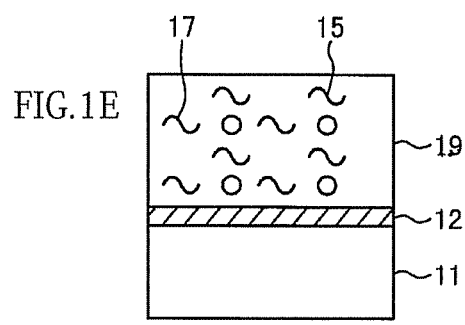
Figure 1B:
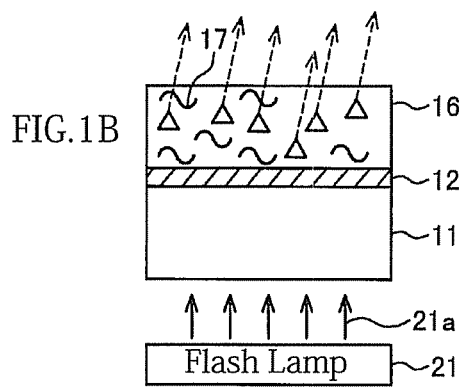

Next, as illustrated in FIG. 1B, light irradiation is performed with a flash lamp 21 from a rear surface of the first substrate 11, i.e., a surface opposite to the surface over which the above-described layer 16 is formed as shown by an arrow 21a. Irradiation conditions at this time are conditions under which the irradiation is performed with energy intensity greater than or equal to energy intensity with which a high molecular compound 17 is softened, and conditions stronger than conditions of third heat treatment to be described later. The irradiation light is transmitted through the first substrate 11 and absorbed in the absorption layer 12. The absorbed light is converted to heat energy, whereby a portion of the layer 16, which overlaps with the absorption layer 12, is heated to a temperature higher than or equal to the glass transition temperature of the high molecular compound 17 (first heat treatment). Thus, an impurity 14 in the above-described layer 16, such as moisture, a residual solvent, or a residual monomer, is removed (see FIGS. 1B and 1C). Note that the molecular weight of the impurity 14 is less than or equal to 300.

Figure 1F:
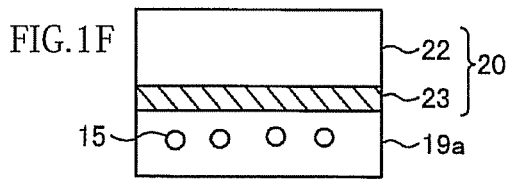
Figure 1C:
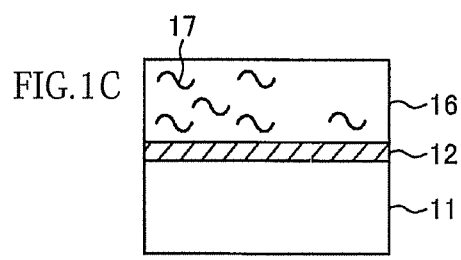
Figure 1D:
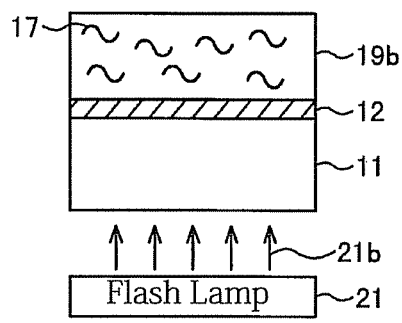
Figure 1D:
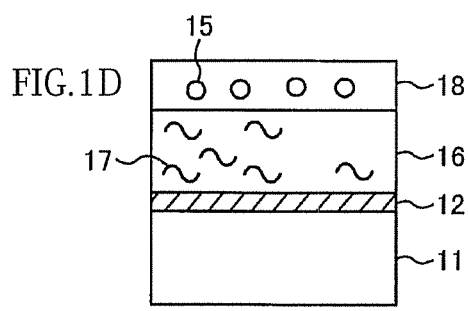

Next, as illustrated in FIG. 1D, an organic EL material layer (hereinafter referred to as "material layer") 18 containing at least an organic material 15 as the first film formation material and an organic material as the second film formation material (not illustrated) is formed over the above-described layer 16. The first film formation material and the second film formation material are materials which are to be transferred onto a second substrate by being heated. In this embodiment, two kinds of materials which are the first film formation material and the second film formation material are used for the material layer 18; however, three or more kinds of film formation materials can also be used for the material layer 18. Further, the material layer 18 may be a single layer or a stacked layer including plural layers. Note that in this embodiment, "being transferred" means that the first film formation material and the second film formation material which are contained in the mixed layer 19 are moved onto the film-formation target substrate.

The material layer 18 is formed under a reduced pressure atmosphere by a method such as a vacuum evaporation method or a sputtering method which is a dry method. The reduced pressure atmosphere can be obtained by evacuation of a film-formation chamber with a vacuum exhaust unit to a vacuum of about $5 \times 10^{-3}$ Pa or less, preferably, about $10^{-4}$ Pa to $10^{-6}$ Pa. A dry method enables less impurity to be mixed into the material layer 18 than a wet method. Further, since the material layer 18 is formed under a reduced pressure atmosphere, an impurity is less likely to be mixed into the material layer 18.

Next, the layer 16 containing the high molecular compound and the material layer 18 are subjected to second heat treatment, whereby as illustrated in FIG. 1E, a mixed layer 19 in which the first film formation material and the second film formation material in the material layer 18 are thermally diffused into the layer 16 containing the high molecular compound to mix the layer 16 and the material layer 18 can be formed over the absorption layer 12. Note that a temperature at which the first film formation material and the second film formation material are diffused into the high molecular compound is lower than a temperature at which the first film formation material and the second film formation material in the mixed layer 19 are transferred onto the film-formation target substrate. Further, the second heat treatment may be performed by irradiation with light from the rear surface of the first substrate 11 using a flash lamp. Irradiation conditions at this time are conditions under which the temperature of the layer 16 and the material layer 18 is higher than the glass transition temperature of the high molecular compound in the layer 16.

Thus, the film-formation substrate (donor substrate) having the mixed layer 19 into which less impurity such as moisture, a residual solvent, or a residual monomer is mixed is manufactured.

The mixed layer 19 is a layer containing a material transferred onto the second substrate by being heated, and is a layer formed so as to contain the organic material 15 as the first film formation material and the organic material as the second film formation material (not illustrated) which are formed on the film-formation target substrate.

In this embodiment, in order to form an EL layer of the light-emitting element over the film-formation target substrate, a light-emitting substance is used for the organic material 15 as the first film formation material contained in the mixed layer 19, and an organic compound in which the light-emitting substance is dispersed is used for the second film formation material.

As the light-emitting substance, for example, a fluorescent compound which emits fluorescence or a phosphorescent compound which emits phosphorescence can be used.

As the organic compound in which the light-emitting substance is to be dispersed, in the case where the light-emitting substance is a fluorescent compound, a substance having higher singlet excitation energy (the energy difference between a ground state and a singlet excited state) than the fluorescent compound is preferably used. In the case where the light-emitting substance is a phosphorescent compound, a substance having higher triplet excitation energy (the energy difference between a ground state and a triplet excited state) than the phosphorescent compound is preferably used.

Note that as a film formation material contained in the mixed layer 19, two or more kinds of organic compounds in which the light-emitting substance is to be dispersed may be used, and two or more kinds of light-emitting substances which are to be dispersed in the organic compound may be used. Alternatively, two or more kinds of organic compounds in which the light-emitting substance is to be dispersed and two or more kinds of light-emitting substances may be used.

As the high molecular compound 17 contained in the mixed layer 19, a high molecular compound having a glass transition temperature satisfying a formula (1) below is used. Preferably, a high molecular compound having a glass transition temperature satisfying a formula (2) below is used. Note that in the formulas (1) and (2) below, the sublimation temperatures of the first film formation material and the second film formation material are measured under the same degree of vacuum (for example, a degree of vacuum of $10^{-3}$ Pa).

$$Ta-100 \leq S \leq 400 \tag{1}$$

$$Ta-70 \leq S \leq 400 \tag{2}$$

Note that in the formulas (1) and (2), S represents a glass transition temperature (° C.) of a high molecular compound, and Ta represents a temperature (° C.) which is the higher of sublimation temperatures of the first film formation material and the second film formation material.

When the glass transition temperature of the high molecular compound 17 is in the range satisfying the formula (1) above, preferably the formula (2) above, even at the sublimation temperature of the first film formation material or that of the second film formation material, whichever is lower, the film formation material reaching the sublimation temperature is not easily transferred from the mixed layer 19. This is because the movement of the first film formation material and the second film formation material in the mixed layer 19 is suppressed by the high molecular compound 17. Further, when the temperature of the mixed layer 19 exceeds the higher of the sublimation temperatures of the first film formation material and the second film formation material, the first film formation material and the second film formation material are easily moved in the mixed layer 19 and transferred onto the film-formation target substrate. Thus, a time difference is not easily generated between the transfer of the first film formation material and the transfer of the second film formation material, and accordingly, an EL layer having a lower concentration gradient can be formed on the film-formation target substrate.

However, if the glass transition temperature of the high molecular compound 17 is lower than the range satisfying the formula (1) above, it is difficult to suppress the movement of the first film formation material and the second film formation material in the mixed layer 19. Therefore, when the temperature of the mixed layer 19 reaches the sublimation temperature of the first film formation material or that of the second film formation material, which is lower, the film formation material having a lower sublimation temperature is transferred first, and then, the film formation material having a higher sublimation temperature is transferred. If the glass transition temperature of the high molecular compound is higher than the range satisfying the formula (1) above, the movement of the first film formation material and the second film formation material in the mixed layer 19 is suppressed even after the temperature of the mixed layer 19 exceeds the higher of the sublimation temperatures of the first film formation material and the second film formation material. Therefore, the transfer is not easily performed.

Thus, as the high molecular compound 17, a high molecular compound having a glass transition temperature satisfying the formula (1) above, preferably the formula (2) above is used.

Note that in the case where a material having a glass transition temperature of 200° C., a material having a sublimation temperature of 210° C., and a material having a sublimation temperature of 260° C. are used as the high molecular compound 17, the first film formation material, and the second film formation material, respectively, a favorable transfer is realized. In contrast, in the case where a material having a glass transition temperature of 200° C., a material having a sublimation temperature of 210° C., and a material having a sublimation temperature of 302° C. are used as the high molecular compound 17, the first film formation material, and the second film formation material, respectively, a favorable transfer is not realized. This shows that a preferred mixed layer 19 is realized under conditions satisfying the formulas (1) and (2) above.

As the high molecular compound 17 contained in the mixed layer 19, cycloolefin polymer is preferable. Cycloolefin polymer is dissolved easily in a solvent. Therefore, when cycloolefin polymer containing the first film formation material and the second film formation material that are left on the film-formation substrate after the formation of a film on the film-formation target substrate is redissolved in a solvent, the film-formation substrate can be reused. Thus, the consumption and cost of a material can be reduced. As the high molecular compound 17, olefin, vinyl, acrylic, polyimide (PI), or the like may be used, or an EL material of a high molecular material may be used. As the EL material of a high molecular material, for example, poly(N-vinylcarbazole) (PVK) and poly(p-phenylenevinylene) (PPV) can be given. Further, a cross-linked polymer such as an epoxy resin, an acrylic resin, or siloxane may be used. Note that in this specification, a high molecular compound means a polymer having a repetition structure using one or plural kinds of monomers.

Next, a method for forming a film by transferring the materials contained in the mixed layer 19 onto a film-formation target substrate 20 using the film-formation substrate as illustrated in FIG. 1F is described.

A second substrate 22 which is a film-formation target substrate is placed in a position facing a surface of the first substrate 11 where the absorption layer 12 and the mixed layer 19 are formed. The second substrate 22 is a film-formation target substrate on which a desired layer, for example, an electrode layer 23, is formed by a film formation treatment. The second substrate 22 is not limited to a specific one as long as it is a substrate having a needed heat resistance property and having an insulating property on its surface. For example, a glass substrate, a quartz substrate, a stainless steel substrate provided with an insulating film, and the like can be given as the second substrate 22. Alternatively, a plastic substrate having a heat resistance property enough to withstand heat treatment may be used.

After that, the third heat treatment is performed from the rear surface of the first substrate 11, i.e., the other surface of the first substrate 11 where the mixed layer 19 is formed, whereby the first film formation material and the second film formation material in the mixed layer 19 are formed on the second substrate 22. Thus, an EL layer 19a of a light-emitting element is formed on the second substrate 22, and a layer 19b containing the high molecular compound 17 is left over the first substrate 11. The third heat treatment is performed by irradiation with light using the flash lamp 21 as shown by an arrow 21b. Specifically, the irradiation light is transmitted through the first substrate 11 and absorbed in the absorption layer 12. The absorbed light is converted to heat energy, whereby a portion of the mixed layer 19, which overlaps with the absorption layer 12, is heated. The mixed layer 19 is heated, whereby the EL layer 19a is formed on the electrode layer 23.

Note that the EL layer 19a is fat ned to be thinner than the mixed layer 19. Further, a decomposed matter of the high molecular compound 17 may be mixed into the EL layer 19a. Accordingly, the high molecular compound contained in the mixed layer 19 is preferably a material whose decomposed matter does not affect characteristics of the EL layer.

In this embodiment, the temperature of the third heat treatment is preferably set higher than the sublimation temperature of the first film formation material and that of the second film formation material in a range which exceeds the sublimation temperature of the first film formation material and that of the second film formation material and which is lower than or equal to 50° C. Here, the temperature of the heat treatment is measured at the surface of the first substrate.

Further, the third heat treatment is preferably performed so that the temperature of the mixed layer 19 reaches a temperature higher than or equal to the highest sublimation temperature of the sublimation temperatures of the first film formation material and the second film formation material. In this case, the temperature is preferably set high in the range of the temperature which exceeds the sublimation temperature of the film formation material having the highest sublimation temperature or sublimation temperature but is lower than or equal to 50° C. However, the temperature may be set low in the range of the temperature (higher than or equal to the sublimation temperature of a substance having the highest sublimation temperature) in consideration of the decomposition temperature of a substance having a lower sublimation temperature, a distance from the film-formation target substrate, and a material and the thickness of the film-formation target substrate.

Note that in this embodiment, a flash lamp is used as a light source of the irradiation light in each of the first to third heat treatment; however, any of a variety of light sources can be used.

For example, a discharge lamp such as a xenon lamp or a metal halide lamp, or an exothermic lamp such as a halogen lamp or a tungsten lamp can be used as the light source. Alternatively, such a light source may be used as a flash lamp (e.g., a xenon flash lamp or a krypton flash lamp). Since a flash lamp is capable of emitting very high-intensity light repeatedly to a large area for a short time (0.1 msec to 10 msec), it can heat the substrate uniformly and efficiently regardless of the area of the first substrate. In addition, heating of the first substrate 11 can also be controlled by a change in length of a light emitting period.

Alternatively, a laser oscillation device may be used as the light source. As the laser light, it is possible to use laser light emitted from, for example, a gas laser such as an Ar laser, a Kr laser, or an excimer laser; a laser using, as a medium, single crystal YAG, YVO$_4$, forsterite (Mg$_2$SiO$_4$), YAlO$_3$, or GdVO$_4$, or polycrystalline (ceramic) YAG, Y$_2$O$_3$, YVO$_4$, YAlO$_3$, or GdVO$_4$ doped with one or more of Nd, Yb, Cr, Ti, Ho, Er, Tm, and Ta as a dopant; a glass laser; a ruby laser; an alexandrite laser; a Ti:sapphire laser; a copper vapor laser; a gold vapor laser; or a combination thereof. A solid-state laser whose laser medium is solid has advantages in that a maintenance-free condition can be maintained for a long time and output is relatively stable.

Note that as the irradiation light, infrared light (a wavelength of 800 nm or more) is preferably used. With infrared light, the absorption layer 12 can efficiently convert it to heat, and thus the film formation material can be efficiently heated.

Further, each of the first to third heat treatment is preferably performed in an atmosphere containing little moisture and oxygen or in a reduced-pressure atmosphere. The reduced-pressure atmosphere can be obtained by performing vacuum evacuation of a film-formation chamber so that the degree of vacuum is about $5 \times 10^{-3}$ Pa or less, preferably, in a range of about $10^{-4}$ Pa to $10^{-6}$ Pa.

According to this embodiment, after the layer 16 containing the high molecular compound (polymer) 17 and the impurity 14 is formed over the absorption layer 12 of the first substrate 11 by a wet method, the first heat treatment by which this layer 16 is heated to a temperature higher than or equal to the glass transition temperature of the high molecular compound 17 is performed. Thus, the impurity 14 such as moisture, a residual solvent, or a residual monomer can be removed from the layer 16, so that the layer 16 where the amount of the impurity is reduced can be obtained (see FIG. 1C). As a result, as illustrated in FIG. 1E, the mixed layer 19 where the amount of the impurity is reduced can be obtained. Accordingly, the impurity in the EL layer 19a which is formed by transfer onto the film-formation target substrate 20 and which is a layer containing the first film formation material and the second film formation material can be reduced. Thus, an organic EL element having favorable characteristics and high reliability can be manufactured.

Note that although the case where the second substrate 22 which is a film-formation target substrate is located above the first substrate 11 which is a film-formation substrate is illustrated in this embodiment, this embodiment is not limited to this. The orientation of the substrates to be placed can be set as appropriate.

[Embodiment 2]

In this embodiment, a film forming method of one embodiment of the present invention is described. Note that in this embodiment, the case where an EL layer of a light-emitting element is formed using a film forming method of one embodiment of the present invention is described. Note that the film forming method described in this embodiment is performed using a material and a manufacturing method that are similar to those of Embodiment 1 if not otherwise stated.

FIG. 2 and FIG. 3 show an example of the case of forming a reflective layer and a heat-insulating, layer over a first substrate. In FIG. 2A, a reflective layer 203 is selectively formed over one surface of a first substrate 201 that is a supporting substrate. Note that the reflective layer 203 has an opening. Further, a heat-insulating layer 205 is formed over the reflective layer 203. Note that in the heat-insulating layer 205, an opening is formed at a position which overlaps with the opening of the reflective layer 203. Further, an absorption layer 207 covering the openings is formed over the first substrate 201 provided with the reflective layer 203 and the heat-insulating layer 205. Furthermore, a layer 208 containing a high molecular compound (polymer) and an impurity is formed over the absorption layer 207.

Hereinafter, a method for manufacturing a film-formation substrate and a film forming method using the film-formation substrate are described.

First, the reflective layer 203 is selectively formed over one surface of the first substrate 201. The reflective layer 203 is a layer which reflects and blocks irradiation light to the first substrate 201 so as not to conduct heat to a portion of the layer 208, which overlaps with the reflective layer 203. Therefore, the reflective layer 203 is preferably formed using a material having a high reflectance with respect to the irradiation light. Specifically, the reflective layer 203 is preferably formed using a material having a reflectance of as high as 85% or more, more preferably, a reflectance of as high as 90% or more with respect to irradiation light.

Further, as a material which can be used for the reflective layer 203, for example, aluminum, silver, gold, platinum, copper, an alloy containing aluminum (for example, an aluminum-titanium alloy, an aluminum-neodymium alloy, and an aluminum-titanium alloy), an alloy containing silver (a silver-neodymium alloy) or the like can be used.

Note that the reflective layer 203 can be formed by any of a variety of methods. For example, the reflective layer 203 can be formed by a sputtering method, an electron beam evaporation method, a vacuum evaporation method, or the like. It is preferable that the thickness of the reflective layer 203 be greater than or equal to 100 nm although it depends on a material. With a thickness of greater than or equal to 100 nm, transmission of the irradiation light through the reflective layer 203 can be suppressed.

Note that the kind of suitable material for the reflective layer 203 varies depending on the wavelength of light with which the first substrate 201 is irradiated. In addition, the reflective layer is not limited to a single layer and may include a plurality of layers. Further, the absorption layer 207 may be directly formed over the first substrate 201 without providing the reflective layer.

In addition, the greater the difference in reflectance between the reflective layer 203 and the absorption layer 207 is, the more preferable it is. Specifically, the difference in reflectance with respect to the wavelength of the irradiation light is preferably 25% or higher, more preferably, 30% or higher.

In addition, although any of a variety of methods can be employed for forming the opening in the reflective layer 203, dry etching is preferably used. By use of dry etching, the opening has a sharper sidewall, and thus a fine pattern can be formed.

Next, the heat-insulating layer 205 is selectively formed over the reflective layer 203. For the heat-insulating layer 205, for example, titanium oxide, silicon oxide, silicon oxynitride, zirconium oxide, titanium carbide, or the like can be preferably used. Note that for the heat-insulating layer 205, a material having lower heat conductivity than materials used for the reflective layer 203 and the absorption layer 207 is used. Note that in this specification, oxynitride is a substance which contains more oxygen than nitrogen in composition.

The heat-insulating layer 205 can be formed by any of a variety of methods. For example, the heat-insulating layer 205 can be formed by a sputtering method, an electron beam evaporation method, a vacuum evaporation method, a CVD (chemical vapor deposition) method, or the like. Further, the thickness of the heat-insulating layer can be greater than or equal to 10 nm and less than or equal to 2 μm, preferably greater than or equal to 100 nm and less than or equal to 600 nm, although it depends on a material.

In addition, in the heat-insulating layer 205, an opening is formed in the region which overlaps with the opening of the reflective layer 203. Although any of a variety of methods can be used for forming a pattern of the heat-insulating layer 205, dry etching is preferably used. By use of dry etching, the patterned heat-insulating layer 205 has a sharper sidewall and thus a fine pattern can be formed.

Note that preferably, the heat-insulating layer 205 and the reflective layer 203 are patterned in one-time etching process, and accordingly the sidewalls of the openings provided in the heat-insulating layer 205 and the reflective layer 203 can be aligned with each other, whereby a finer pattern can be formed.

Further, although the heat-insulating layer 205 is formed only in the position which overlaps with the reflective layer 203 in this embodiment, the heat-insulating layer 205 may be formed to cover the reflective layer 203 and the opening of the reflective layer 203. In this case, the heat-insulating layer 205 needs to have a transmitting property with respect to visible light.

Next, the absorption layer 207 is formed over the heat-insulating layer 205. For the absorption layer 207, a material which is similar to that of the absorption layer 12 described in Embodiment 1 can be used. Note that the absorption layer 207 may be selectively formed. For example, after the absorption layer 207 is formed over an entire surface of the first substrate 201, the absorption layer 207 is patterned into an island-like shape to cover the openings of the reflective layer 203 and the heat-insulating layer 205. In this case, heat conduction in the plane direction of the absorption layer can be prevented and thus the EL layer can be patterned more finely as compared to the case where the absorption layer is formed over the entire surface, and accordingly, a high-performance light-emitting device can be realized.

Next, the layer 208 containing a high molecular compound (polymer) and an impurity is formed over the absorption layer 207. As the layer 208, a layer similar to the layer 16 in Embodiment 1 can be used.

Then, as shown in FIG. 2B, irradiation of light is performed using a flash lamp as indicated by an arrow from a rear surface of the first substrate 201, i.e., a surface opposite to a surface where the above-described layer 208 is formed. Irradiation conditions at this time are conditions under which the irradiation is performed with energy intensity greater than or equal to energy intensity with which a high molecular compound is softened, and conditions stronger than conditions of the third heat treatment to be described later. The irradiation light is transmitted through the first substrate 201 and absorbed in the absorption layer 207. The absorbed light is converted to heat energy, whereby the above-described layer 208 is heated to a temperature higher than or equal to the glass transition temperature of the high molecular compound (the first heat treatment). Thus, an impurity in the above-described layer 208, such as moisture, a residual solvent, or a residual monomer, is removed, so that a layer 208a in which the amount of an impurity is reduced is obtained. Note that the molecular weight of this impurity is less than or equal to 300.

Next, as illustrated in FIG. 2C, an organic EL material layer (hereinafter referred to as "material layer") 210 containing at least the first film formation material and the second film formation material (not illustrated) is formed over the above-described layer 208a. As this material layer 210, a layer similar to the material layer 18 in Embodiment 1 can be used.

Next, the layer 208a containing a high molecular compound and the material layer 210 are subjected to second heat treatment, whereby as illustrated in FIG. 3A, a mixed layer 209 in which the first film formation material and the second film formation material in the material layer 210 are thermally diffused into the layer 208a containing the high molecular compound to mix the layer 208a and the material layer 210 can be formed over the absorption layer 207. This mixed layer 209 is similar to the mixed layer 19 in Embodiment 1, and as the second heat treatment, heat treatment similar to the second heat treatment in Embodiment 1 is used.

Thus, the film-formation substrate (donor substrate) having the mixed layer 209 into which less impurity such as moisture, a residual solvent, or a residual monomer is mixed is manufactured.

Next, as illustrated in FIG. 3B, a second substrate 211 is placed in a position facing a surface of the first substrate 201 where the mixed layer 209 and the like are formed. Note that since the case where an EL layer of a light-emitting element is formed using the film-formation substrate of one embodiment of the present invention is described here, an electrode layer 213 which is to be one of electrodes of the light-emitting element is provided over the second substrate 211. Edge portions of the electrode layer 213 are preferably covered with an insulator 215. In this embodiment, the electrode layer represents an electrode to be an anode or a cathode of a light-emitting element.

A surface of the mixed layer 209 and a surface of the second substrate 211 are placed to have a distance d therebetween. Here, the distance d is greater than or equal to 0 mm and less than or equal to 2 mm, preferably, greater than or equal to 0 mm and less than or equal to 0.05 mm, more preferably, greater than or equal to 0 mm and less than or equal to 0.03 mm.

Note that a distance d is defined as a distance between a surface of the mixed layer 209 formed over the first substrate and a surface of the second substrate. However, in the case where a certain kind of film (for example, a conductive film serving as an electrode, a partition wall, or the like) is formed on the second substrate and thus the surface of the film-formation target substrate has unevenness, the distance d is defined as a distance between the surface of the mixed layer 209 over the first substrate, and a topmost surface of a layer formed on the second substrate, that is, a surface of the film (the conductive film, the partition wall, or the like).

After that, as illustrated in FIG. 3C, irradiation of light is performed from the rear surface of the first substrate 201 with a flash lamp as indicated by an arrow. Irradiation conditions at this time are conditions under which the irradiation is performed with energy intensity greater than or equal to energy intensity with which a material contained in the mixed layer 209 is sublimed. The irradiation light is transmitted through the first substrate 201, reflected in a region where the reflective layer 203 is formed, and transmitted through the opening provided in the reflective layer 203, so that the light is absorbed in a portion of the absorption layer 207, which overlaps with the opening. The absorbed light is converted to heat energy, whereby a portion of the mixed layer 209, which overlaps with the portion of the absorption layer 207, is heated (the third heat treatment), so that the first film formation material and the second film formation material which are contained in the mixed layer 209 are fanned over the second substrate 211. Accordingly, an EL layer 217 of a light-emitting element is selectively formed over the second substrate 211.

According to this embodiment, after the layer 208 containing a high molecular compound (polymer) and an impurity is formed over the absorption layer 207 of the first substrate 201 by a wet method, the first heat treatment by which this layer 208 is heated to a temperature higher than or equal to the glass transition temperature of the high molecular compound is performed. Thus, an impurity such as moisture, a residual solvent, or a residual monomer can be removed from the layer 208, so that the layer 208a in which the amount of an impurity is reduced can be obtained (see FIG. 2B). As a result, as illustrated in FIG. 3A, the mixed layer 209 in which the amount of an impurity is reduced can be obtained. Accordingly, an impurity in the EL layer 217 which is formed by transfer onto the film-formation target substrate and which is a layer containing the first film formation material and the second film formation material can be reduced. Thus, an organic EL element having favorable characteristics and high reliability can be manufactured.

REFERENCE NUMERALS

10 Film-formation substrate (Donor substrate)
11 First substrate
12 Absorption layer
14 Impurity
15 Organic material
16 Layer containing high molecular compound (polymer) and an impurity
17 High molecular compound (polymer)
18 Material layer
19 Mixed layer
19a EL layer
19b Layer containing high molecular compound
21 Flash lamp
21a, 21b Arrow
22 Second substrate
23 Electrode layer
201 First substrate
203 Reflective layer
205 Heat-insulating layer
207 Absorption layer
208 Layer containing high molecular compound (polymer) and impurity
208a Layer in which amount of impurity is reduced
209 Mixed layer
210 Material Layer
211 Second substrate
213 Electrode layer
215 Insulator
217 EL layer

The invention claimed is:

1. A film forming method comprising the steps of:
forming an absorption layer over a one surface of a first substrate;
forming a layer containing a polymer compound over the absorption layer;
removing an impurity in the layer containing the polymer compound by performing a first heat treatment on the layer containing the polymer compound at a temperature higher than or equal to a glass transition temperature of the polymer compound from the other surface of the first substrate;
forming a material layer containing a first film formation material and a second film formation material over the layer containing the polymer compound;
forming a mixed layer in which the material layer and the layer containing the polymer compound are mixed over the absorption layer by performing a second heat treatment on the material layer and the layer containing the polymer compound;
placing a one surface of the first substrate and a film formation target surface of a second substrate so as to face each other; and
forming a layer containing the first film formation material and the second film formation material over the film formation target surface of the second substrate by performing a third heat treatment on the mixed layer from the other surface of the first substrate,
wherein the polymer compound, the first film formation material and the second film formation material satisfy the following range below, $Ta-100 \leq S \leq 400$, wherein S represents the glass transition temperature (° C.) of the polymer compound, and Ta represents a temperature (° C.) which is the higher sublimation temperature of the first film formation material and the second film formation material wherein the absorption layer is heated to a first temperature by the second heat treatment, wherein the absorption layer is heated to a second temperature by the third heat treatment, and wherein the first temperature is lower than the second temperature.

2. The film forming method according to claim 1, wherein the first heat treatment, the second heat treatment, and the third heat treatment are each performed using a method of applying heat by light irradiation from the other surface of the first substrate using a light source and by absorption of the light in the absorption layer.

3. The film forming method according to claim 1, wherein the one surface of the first substrate and the film formation target surface of the second substrate are placed so as to face each other after the second heat treatment is performed.

4. The film forming method according to claim 1, wherein the polymer compound is poly(N-vinylcarbazole).

5. The film forming method according to claim 1,
wherein a reflective layer is formed between the absorption layer and the one surface of the first substrate.

6. The film forming method according to claim 5,
wherein a heat-insulating layer is formed between the absorption layer and the reflective layer.

7. The film forming method according to claim 1,
wherein the first heat treatment is performed under degree of vacuum of $10^{-4}$ Pa to $10^{-6}$ Pa.

8. The film forming method according to claim 1,
wherein the first temperature is higher than the glass transition temperature of the polymer compound.

9. The film forming method according to claim 1,
wherein the absorption layer is heated to a first temperature by the first heat treatment, and
wherein the second temperature is lower than the third temperature.

* * * * *

UNITED STATES PATENT AND TRADEMARK OFFICE
CERTIFICATE OF CORRECTION

PATENT NO.         : 8,815,352 B2                                     Page 1 of 1
APPLICATION NO.    : 13/635177
DATED              : August 26, 2014
INVENTOR(S)        : Tomoya Aoyama et al.

It is certified that error appears in the above-identified patent and that said Letters Patent is hereby corrected as shown below:

In the Specification:

Column 1, Line 22; Change "film-fat Illation" to --film-formation--.

Column 2, Line 19; Change "fanned" to --formed--.

Column 4, Line 16; Change "faulted" to --formed--.

Column 4, Line 32; Change "is, preferable" to --is preferable--.

Column 8, Line 22; Change "fat ned" to --formed--.

Column 12, Line 60; Change "fanned" to --formed--.

In the Claims:

Column 14, Line 55, Claim 9; Change "a first temperature" to --a third temperature--.

Signed and Sealed this
Second Day of June, 2015

Michelle K. Lee
*Director of the United States Patent and Trademark Office*